US012577672B2

(12) United States Patent
Pyeon et al.

(10) Patent No.: US 12,577,672 B2
(45) Date of Patent: Mar. 17, 2026

(54) REACTION GAS SUPPLY SYSTEM

(71) Applicant: SAMSUNG ELECTRONICS CO., LTD., Suwon-si (KR)

(72) Inventors: Jungjoon Pyeon, Hwaseong-si (KR); Seoyoung Maeng, Seoul (KR); Iljun Jeon, Hwaseong-si (KR); Suji Gim, Hwaseong-si (KR); Youngseok Roh, Hwaseong-si (KR); Jongyong Bae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/386,667

(22) Filed: Jul. 28, 2021

(65) Prior Publication Data

US 2022/0195603 A1 Jun. 23, 2022

(30) Foreign Application Priority Data

Dec. 21, 2020 (KR) ......................... 10-2020-0179327

(51) Int. Cl.
*B01J 4/00* (2006.01)
*B05B 12/14* (2006.01)
(Continued)

(52) U.S. Cl.
CPC .............. *C23C 16/52* (2013.01); *B01J 4/001* (2013.01); *B01J 4/008* (2013.01); *B05B 12/14* (2013.01);
(Continued)

(58) Field of Classification Search
CPC .......... C23C 16/4544; C23C 16/45561; C23C 16/448; B65B 1/04; B65B 31/02;
(Continued)

(56) References Cited

U.S. PATENT DOCUMENTS 100,282 A * 3/1870 Goodwin .................. F17C 1/04
220/62.16
665,349 A * 1/1901 Sewall ...................... F17C 3/08
220/745
(Continued)

FOREIGN PATENT DOCUMENTS

JP 2012-167317 A 9/2012
KR 10-2005-0036007 A 4/2005
(Continued)

OTHER PUBLICATIONS

Burton, Beau, "Comprising is Not a Weasel Word", Sep. 24, 2020, Element IP, pp. 1-2, https://www.elementiplaw.com/comprising-is-not-a-weasel-word/.*
(Continued)

*Primary Examiner* — Karl Kurple
(74) *Attorney, Agent, or Firm* — Fish & Richardson P.C.

(57) ABSTRACT

A reaction gas supply system includes a reaction chamber configured to process a substrate using a reaction gas, a mass flow controller (MFC) configured to control an amount of the reaction gas supplied to the reaction chamber, a tank between the reaction chamber and the MFC, the tank having a cylindrical inner space configured to store the reaction gas, and an outlet portion configured to discharge the reaction gas from the tank, and a valve between the tank and the reaction chamber, the outlet portion of the tank having a gradually decreasing diameter toward the valve.

12 Claims, 19 Drawing Sheets

(51) Int. Cl.

| | |
|---|---|
| *C23C 16/455* | (2006.01) |
| *C23C 16/52* | (2006.01) |
| *F17C 1/00* | (2006.01) |
| *F17C 7/00* | (2006.01) |
| *B01B 1/00* | (2006.01) |

(52) U.S. Cl.
CPC ........ *C23C 16/45544* (2013.01); *F17C 1/005* (2013.01); *F17C 7/00* (2013.01); *B01B 1/005* (2013.01); *F17C 2201/0104* (2013.01); *F17C 2201/0142* (2013.01); *F17C 2203/011* (2013.01); *F17C 2203/012* (2013.01)

(58) Field of Classification Search
CPC ................. B65B 31/04; F17C 2201/00; F17C 2201/0142; F17C 2203/00; F17C 2205/03; F17C 2205/0388
USPC .......... 137/581, 487.5; 141/66, 98; 220/608, 220/669, 202, 203.01
See application file for complete search history.

(56) References Cited

U.S. PATENT DOCUMENTS

| | | | | |
|---|---|---|---|---|
| 3,124,001 | A * | 3/1964 | Conley ..................... | F17C 1/16 |
| | | | | 138/DIG. 2 |
| 5,562,132 | A * | 10/1996 | Siegele ................. | G01F 23/292 |
| | | | | 141/95 |
| 5,590,695 | A * | 1/1997 | Siegele ................... | G01F 23/74 |
| | | | | 141/63 |
| 5,607,002 | A * | 3/1997 | Siegele ................ | C23C 16/448 |
| | | | | 141/95 |
| 5,711,354 | A * | 1/1998 | Siegele ............... | B67D 7/0272 |
| | | | | 141/67 |
| 5,850,934 | A * | 12/1998 | Kumar ................... | F17C 13/06 |
| | | | | 220/240 |
| 6,439,253 | B1 * | 8/2002 | Easton ..................... | B67D 7/16 |
| | | | | 137/88 |
| 6,629,627 | B1 * | 10/2003 | Siegele .................. | F17C 13/04 |
| | | | | 141/95 |
| 6,772,781 | B2 * | 8/2004 | Doty ................... | G05D 11/132 |
| | | | | 137/607 |
| 6,773,749 | B1 * | 8/2004 | Moore ............... | C23C 16/4412 |
| | | | | 427/248.1 |

| | | | | |
|---|---|---|---|---|
| 6,787,185 | B2 | 9/2004 | Derderian et al. | |
| 7,087,482 | B2 | 8/2006 | Yeo et al. | |
| 7,740,024 | B2 * | 6/2010 | Brodeur .................. | G01F 1/363 |
| | | | | 700/282 |
| 7,827,932 | B2 | 11/2010 | Kojima et al. | |
| 7,846,497 | B2 * | 12/2010 | Gold ..................... | C23C 16/455 |
| | | | | 427/248.1 |
| 8,215,264 | B2 | 7/2012 | Hong et al. | |
| 2003/0145789 | A1 * | 8/2003 | Bauch ................... | C23C 16/448 |
| | | | | 118/715 |
| 2006/0086099 | A1 * | 4/2006 | Dickerson ............... | F17C 3/085 |
| | | | | 62/48.2 |
| 2006/0272709 | A1 * | 12/2006 | Ting ...................... | A23L 3/0155 |
| | | | | 137/487.5 |
| 2008/0120982 | A1 * | 5/2008 | Dickerson ............. | F25J 1/0017 |
| | | | | 62/49.1 |
| 2010/0213083 | A1 * | 8/2010 | Olander .................. | F17C 11/00 |
| | | | | 222/6 |
| 2013/0309401 | A1 | 11/2013 | Miyatake | |
| 2014/0069931 | A1 * | 3/2014 | Kim ........................ | F17C 3/025 |
| | | | | 220/560.1 |
| 2015/0337678 | A1 | 11/2015 | Alonte et al. | |
| 2016/0201850 | A1 * | 7/2016 | Seymour ................... | F17C 1/10 |
| | | | | 220/586 |
| 2018/0292047 | A1 * | 10/2018 | Lanzl ........................ | F17C 1/06 |
| 2019/0301016 | A1 | 10/2019 | Kang et al. | |
| 2021/0187521 | A1 * | 6/2021 | Mustafa ............ | C23C 16/45565 |
| 2022/0112982 | A1 * | 4/2022 | Dean ........................ | F17C 1/16 |

FOREIGN PATENT DOCUMENTS

| | | | | |
|---|---|---|---|---|
| KR | 10-2007-0087058 | A | 8/2007 | |
| KR | 10-2017-0089152 | A | 8/2017 | |
| KR | 10-2018-0074351 | A | 7/2018 | |
| KR | 10-2019-0075586 | A | 7/2019 | |
| KR | 10-2019-0115392 | A | 10/2019 | |
| KR | 10-2020-0061833 | A | 6/2020 | |
| SU | 1248891 | A1 * | 6/1984 | ............. B63B 35/28 |

OTHER PUBLICATIONS

Article on interpretation of "single" "comprising" (Year: 2020).*
Office Action in Korean Appln. No. 10-2020-0179327, mailed on Aug. 18, 2025, 14 pages (with English translation).

* cited by examiner

FIG. 17

REACTION GAS SUPPLY SYSTEM

CROSS-REFERENCE TO RELATED APPLICATION

Korean Patent Application No. 10-2020-0179327, filed on Dec. 21, 2020, in the Korean Intellectual Property Office, and entitled: "Reaction Gas Supply System, Atomic Layer Deposition Apparatus Including the Same and Method of Processing a Substrate Using the Same," is incorporated by reference herein in its entirety.

BACKGROUND

1. Field

Example embodiments relate to a reaction gas supply system, an atomic layer deposition apparatus including the same, and a method of processing a substrate using the same. More particularly, example embodiments relate to a reaction gas supply system including a tank configured to store a reaction gas, an atomic layer deposition apparatus using the system, and a method of processing a substrate using the system.

2. Description of the Related Art

Generally, a semiconductor substrate may be processed using a reaction gas. The reaction gas may be stored in a tank. The reaction gas in the tank may be supplied to a reaction chamber.

SUMMARY

According to example embodiments, there may be provided a reaction gas supply system. The reaction gas supply system may include a mass flow controller (MFC), a tank and a valve. The MFC may be configured to control an amount of a reaction gas supplied to a reaction chamber, which may be configured to process a substrate using the reaction gas. The tank may be arranged between the reaction chamber and the MFC to store the reaction gas. The tank may have a volume of about 0.16 l to about 0.24 l. The valve may be arranged between the tank and the reaction chamber.

According to example embodiments, there may be provided a reaction gas supply system. The reaction gas supply system may include a mass flow controller (MFC), a tank and a valve. The MFC may be configured to control an amount of a reaction gas supplied to a reaction chamber, which may be configured to process a substrate using the reaction gas. The tank may be arranged between the reaction chamber and the MFC. The tank may have a cylindrical inner space configured to store the reaction gas. The valve may be arranged between the tank and the reaction chamber. The tank may include an outlet portion configured to inject the reaction gas to the valve. The outlet portion may have gradually decreased diameters toward the valve.

According to example embodiments, there may be provided a reaction gas supply system. The reaction gas supply system may include a mass flow controller (MFC), a tank and a valve. The MFC may be configured to control an amount of a reaction gas supplied to a reaction chamber, which may be configured to process a substrate using the reaction gas. The tank may be arranged between the reaction chamber and the MFC. The tank may have an inner surface on which a spiral portion may be formed. The valve may be arranged between the tank and the reaction chamber.

According to example embodiments, there may be provided an atomic layer deposition (ALD) apparatus. The ALD apparatus may include an ALD chamber, a first evaporator, a first MFC, a first tank, a first valve, a second evaporator, a second MFC, a second tank and a second valve. The first evaporator may evaporate a first reaction material to form a first reaction gas supplied to the ALD chamber. The first MFC may be arranged between the ALD chamber and the first evaporator to control an amount of the first reaction gas supplied to the ALD chamber. The first tank may be arranged between the ALD chamber and the first MFC to store the first reaction gas. The first tank may have a volume of about 0.16 l, to about 0.24 l. The first valve may be arranged between the first tank and the ALD chamber. The second evaporator may evaporate a second reaction material to form a second reaction gas supplied to the ALD chamber. The second MFC may be arranged between the ALD chamber and the second evaporator to control an amount of the second reaction gas supplied to the ALD chamber. The second tank may be arranged between the ALD chamber and the second MFC to store the second reaction gas. The second tank may have a volume of about 0.16 l, to about 0.24 l. The second valve may be arranged between the second tank and the ALD chamber.

According to example embodiments, there may be provided a method of processing a substrate. In the method of processing the substrate, a first reaction material may be evaporated to form a first reaction gas. A second reaction material may be evaporated to form a second reaction gas. The first reaction gas may be stored in a first tank having a volume of about 0.16 l, to about 0.24 l. The second reaction gas may be stored in a second tank having a volume of about 0.16 l, to about 0.24 l. The first reaction gas in the first tank and the second reaction gas in the second tank may then be applied to a substrate in a reaction chamber.

BRIEF DESCRIPTION OF THE DRAWINGS

Features will become apparent to those of skill in the art by describing in detail exemplary embodiments with reference to the attached drawings, in which:

FIG. 17 is a block diagram illustrating an atomic layer deposition apparatus including the reaction gas supply system in FIG. 1;

DETAILED DESCRIPTION

In order to form a layer having a uniform thickness on a memory structure of a semiconductor device, which may have a complicated three-dimensional structure, e.g., with a high aspect ratio, using a reaction gas, it may be required to increase a supplying time of the reaction gas or a supplying pressure of the reaction gas. Increasing the supplying time of the reaction gas may increase the amount of the reaction gas used and the process time, thereby increasing the amount of generated byproducts.

In contrast, example embodiments provide formation of a layer having good step coverage with reduced amount of the reaction gas by increasing the supplying pressure of the reaction gas. In particular, according to example embodiments, formation of such a layer may be provided by an atomic layer deposition (ALD) process.

Figure 1:
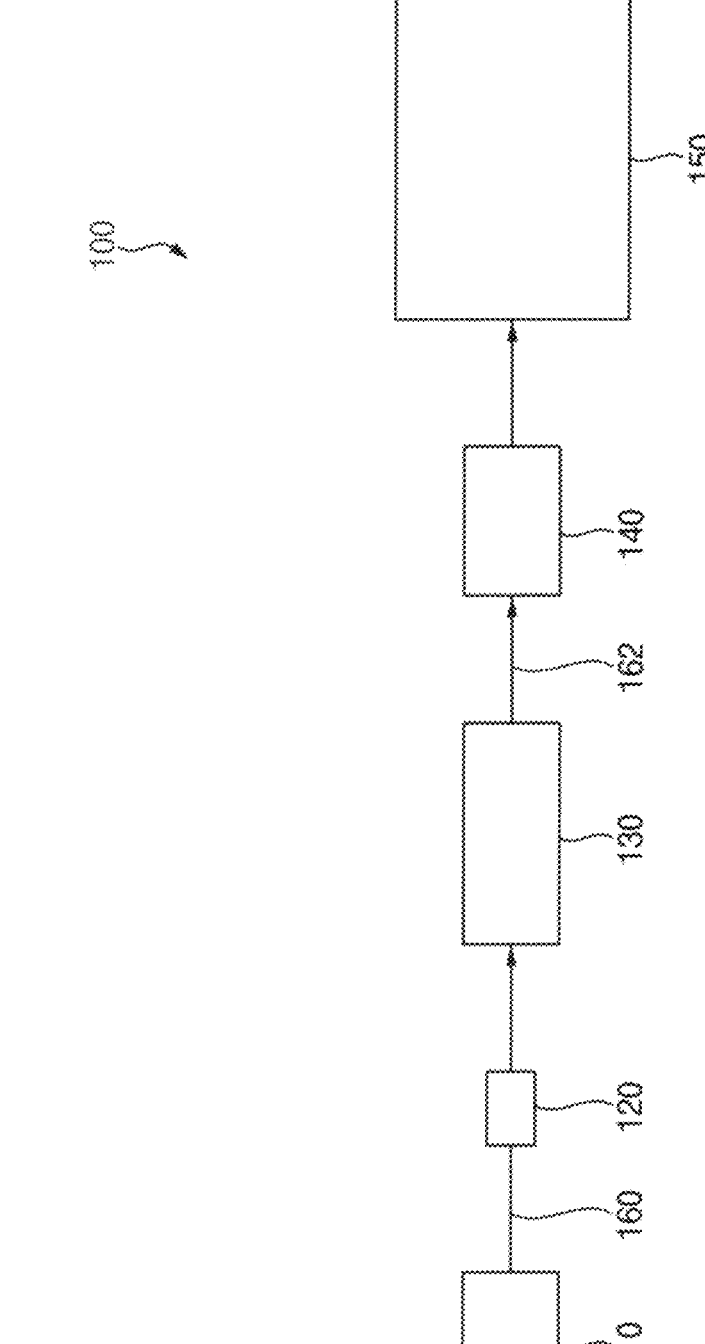
FIG. 1 is a block diagram of a reaction gas supply system in accordance with example embodiments.

FIG. 1 is a block diagram of a reaction gas supply system in accordance with example embodiments.

Referring to FIG. 1, a reaction gas supply system 100 of example embodiments may include an evaporator 110, a mass flow controller (MFC) 120, a tank 130, a valve 140, and a reaction chamber 150.

The evaporator 110 may evaporate a reaction material to form a reaction gas to be supplied to the reaction chamber 150. The reaction chamber 150 may include an ALD chamber, a chemical vapor deposition (CVD) chamber, etc.

The MFC 120 may be arranged between the evaporator 110 and the reaction chamber 150. The MFC 120 may be configured to control an amount of the reaction gas formed by the evaporator 110 supplied to the reaction chamber 150, e.g., the MFC 120 may control the flow rate of the reaction gas from the evaporator 110 into the tank 130. The MFC 120 may determine the amount of the reaction gas supplied to the reaction chamber 150 in accordance with process conditions set in the reaction chamber 150. That is, the MFC 120 may control the amount of the reaction gas supplied to the reaction chamber 150 in accordance with the process conditions.

The tank 130 may be arranged between the MFC 120 and the reaction chamber 150. The tank 130 may be configured to store the reaction gas. An amount of the reaction gas stored in the tank 130 may be determined by the MFC 120. Thus, the reaction gas in the tank 130 may have a charging pressure in accordance with the process conditions. In example embodiments, the tank 130 may have a cylindrical inner space configured to receive the reaction gas. The cylindrical inner space of the tank 130 may have substantially the same, e.g., constant, diameter. However, the inner space of the tank 130 may have other various shapes.

The valve 140 may be arranged between the tank 130 and the reaction chamber 150. The reaction gas in the tank 130 may be supplied to the reaction chamber 150 through the valve 140, i.e., through an opened valve 140. The reaction gas may be continuously supplied from the evaporator 110 to the tank 130 until a pressure of the reaction gas in the tank 130 reaches a set, e.g., predetermined, pressure, i.e., the charging pressure. When the pressure of the reaction gas in the tank 130 reaches the set pressure, i.e., the charging pressure, the valve 140 opens. Thus, the reaction gas having the charging pressure may be supplied from the tank 130 to the reaction chamber 150 through the open valve 140. For example, the valve 140 may include, e.g., be, a pneumatic valve.

A first duct 160 may be connected between the evaporator 110 and the tank 130. The MFC 120 may be installed at the first duct 160, e.g., to control the flow rate in the first duct 160 that enters the tank 130. A second duct 162 may be connected between the tank 130 and the reaction chamber 150. The valve 140 may be installed at the second duct 162.

In example embodiments, the tank 130 may have a volume of about 40% to about 60% of a volume of a conventional tank. That is, the volume of the tank 130 in accordance with example embodiments may be smaller than the volume of the conventional tank. For example, when the volume of the conventional tank is about 0.4 l, the volume of the tank 130 may be about 0.16 l to about 0.24 l. The volume of the tank 130 may be reduced by shortening a diameter and/or an axial length of the conventional tank.

When the volume of the tank 130 is below about 40% of the volume of the conventional tank, an amount of the reaction gas supplied from the tank 130 to the reaction chamber 150 may be too small in quantity. When the volume of the tank 130 is above about 60% of the volume of the conventional tank, the reaction gas in the tank 130 may have a very low charging pressure. Thus, the volume of the tank may be about 0.16 l to about 0.24 l corresponding to about 40% to about 60% of the volume of the conventional tank.

Figure 2:
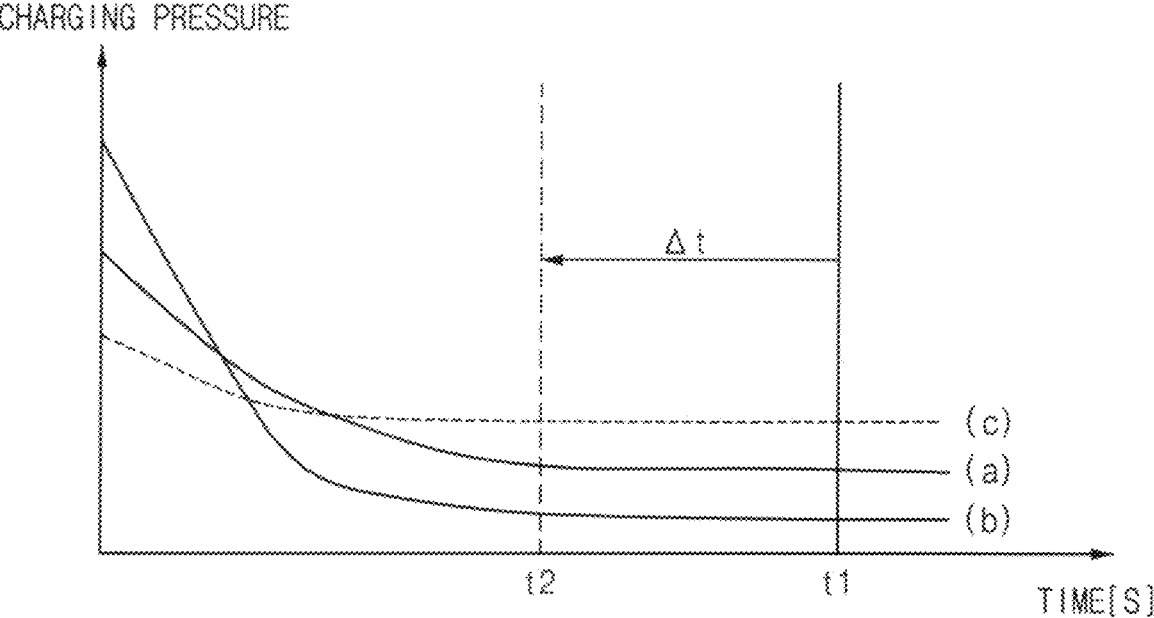
FIG. 2 is a graph showing a change transition of charging pressures in accordance with times in each of tanks in the reaction gas supply system.
Figure 3A:
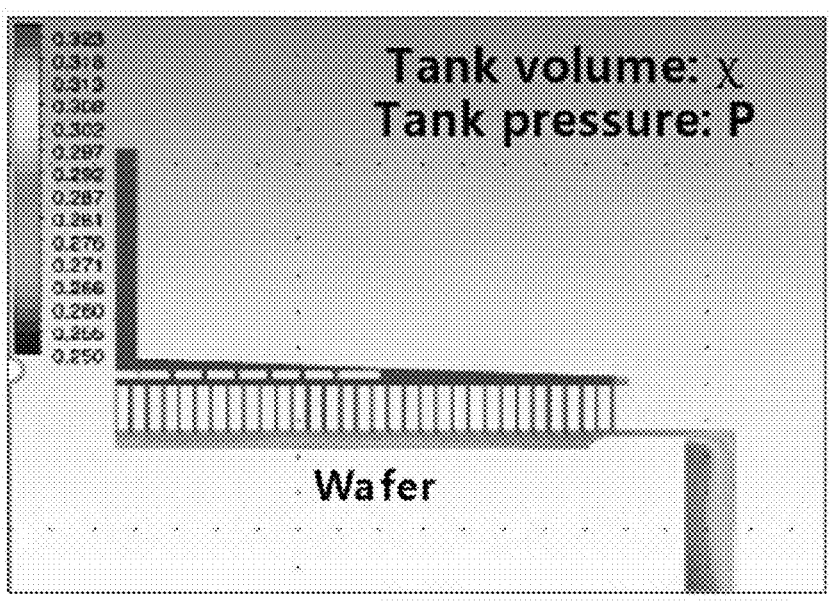
FIG. 3A is a graph showing a charging pressure of a conventional tank in accordance with times.
Figure 3B:
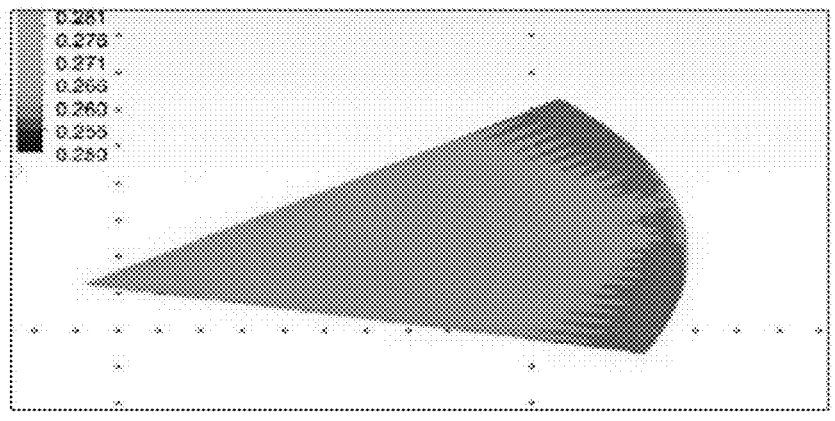
FIG. 3B a view illustrating an amount of a reaction gas applied to a substrate under the condition in FIG. 3A.
Figure 4A:
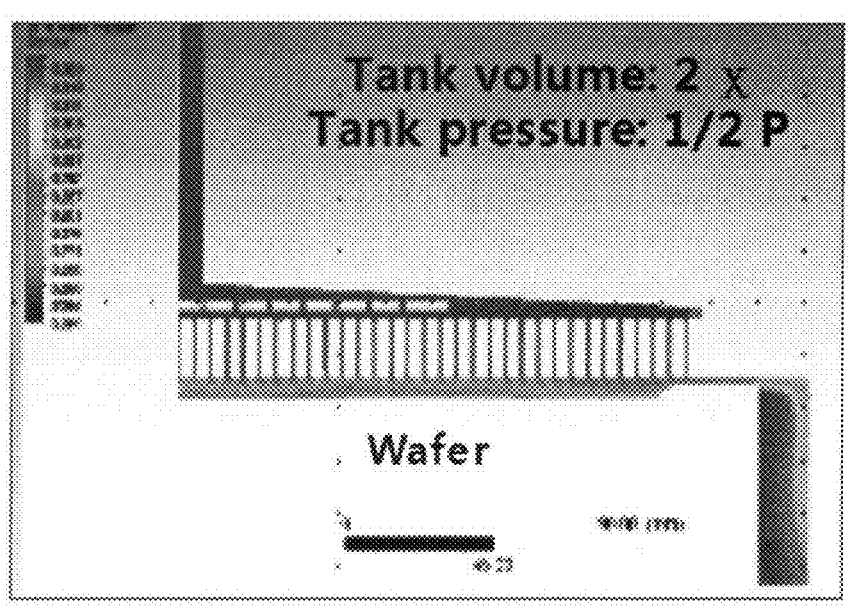
FIG. 4A is a graph showing a charging pressure of a tank having a volume of about two times a volume of a conventional tank in accordance with times.
Figure 4B:
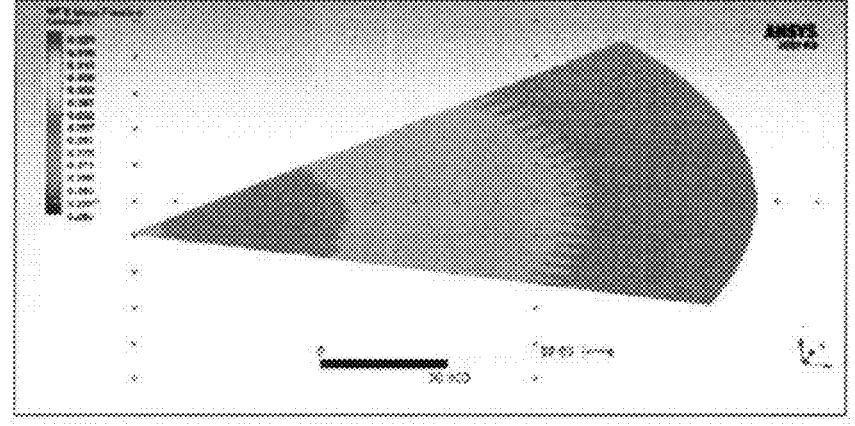
FIG. 4B a view illustrating an amount of a reaction gas applied to a substrate under the condition in FIG. 4A.
Figure 5A:
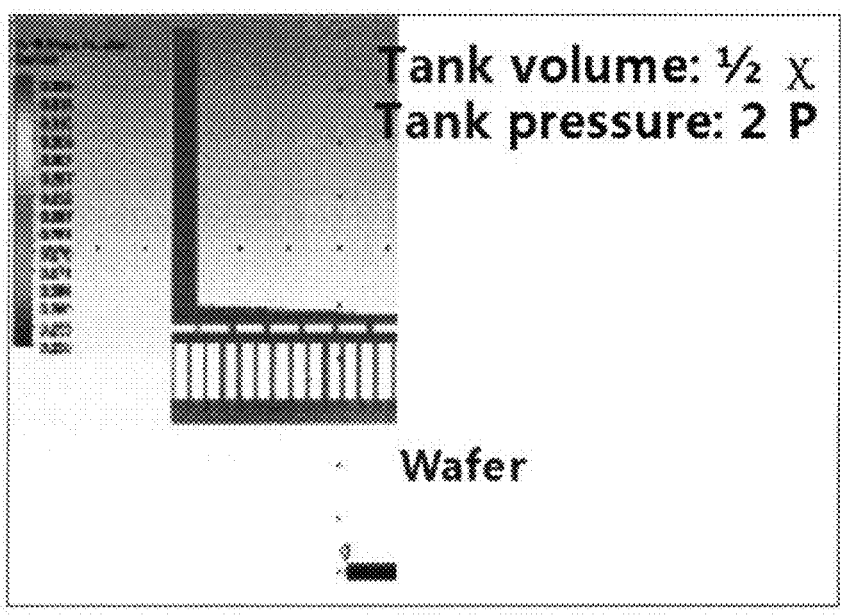
FIG. 5A is a graph showing a charging pressure of a tank having a volume of about ½ times a volume of a conventional tank in accordance with times.
Figure 5B:
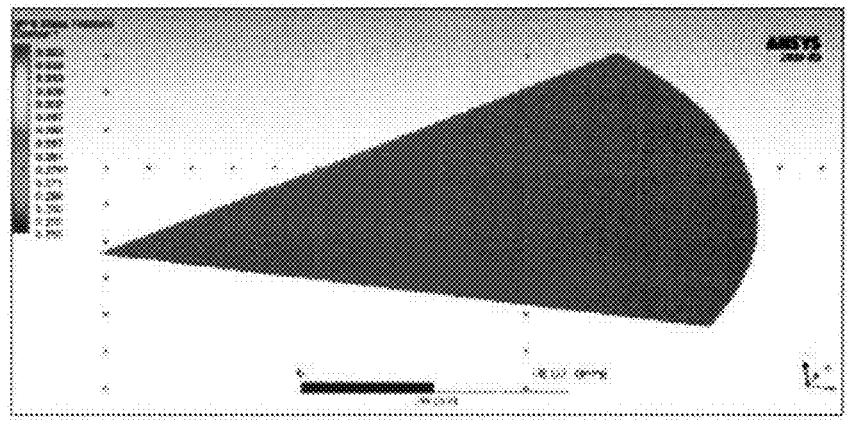
FIG. 5B a view illustrating an amount of a reaction gas applied to a substrate under the condition in FIG. 5A.

FIG. 2 is a graph showing a change transition of charging pressures in accordance with times in each of tanks in the reaction gas supply system, FIG. 3A is a graph showing a charging pressure of a conventional tank in accordance with times, FIG. 3B is a view illustrating an amount of a reaction gas applied to a substrate under the condition in FIG. 3A, FIG. 4A is a graph showing a charging pressure of a tank having a volume of about two times a volume of a conventional tank in accordance with times, FIG. 4B a view illustrating an amount of a reaction gas applied to a substrate under the condition in FIG. 4A, FIG. 5A is a graph showing a charging pressure of a tank having a volume of about ½ times a volume of a conventional tank in accordance with times, and FIG. 5B is a view illustrating an amount of a reaction gas applied to a substrate under the condition in FIG. 5A.

In FIG. 2, the horizontal axis represents time and the vertical axis represents a charging pressure of a reaction gas in a tank. Line (a) indicates a charging pressure of a reaction gas in a conventional tank (corresponds to FIGS. 3A-3B), line (c) indicates a charging pressure of a reaction gas in a tank having a volume of about two times the volume of the conventional tank (corresponds to FIGS. 4A-4B), and line (b) indicates a charging pressure of a reaction gas in a tank having a volume of about ½ times the volume of the conventional tank (corresponds to FIGS. 5A-5B and the tank 130 of FIG. 1).

Referring to FIG. 2, when reaction gases having a same quantity, e.g., flow rate, by the control of the MFC 120 are supplied to the conventional tank and the tank 130 of example embodiments the reaction gas may be supplied from the conventional tank, as shown by line (a), to the reaction chamber 150 for a time t1. And the reaction gas may be supplied from the tank 130, as shown by line (b), to the reaction chamber 150 for a time t2 shorter than the time t1 by the time Δt. For example, the time t refers to the time required to fill the conventional tank or the tank 130 to the charging pressure (which opens the valve) and flow into the reaction chamber 150.

When a same flow rate is used to fill both the conventional tank and the tank 130, because the volume of the tank 130 is about ½ times the volume of the conventional tank, an initial charging pressure (i.e., intersection point on the vertical axis) of the reaction gas in the tank 130 of example embodiments may be higher than an initial charging pressure of the reaction gas in the conventional tank, e.g., may reach the charging pressure faster due to its smaller volume. Thus, an amount of the reaction gas supplied from the tank 130 to the reaction chamber 150 during an initial period may be greater than an amount of the reaction gas supplied from the conventional tank to the reaction chamber, e.g., during a same amount of time.

As mentioned above, when reaction gases having a same quantity, e.g., same flow rate entering the conventional tank and tank 130, are supplied to the conventional tank and the tank 130 of example embodiments, the reaction gas may be supplied from the tank 130 to the reaction chamber 150 for a time t2 shorter than the time t1 by the time Δt. For example, the tank 130 may fill to the charging pressure faster, e.g., than the conventional tank, and therefore, the time required for the reaction gas to reach from the tank 130 to the reaction chamber 150, e.g., due to the higher pressure in a smaller tank and earlier valve 140 opening, may be shorter, e.g., the time being measured from the beginning of tank filling up, thereby having an overall smaller quantity of reaction gas and byproducts flowing though ducts, tank, and reaction chambers.

Further, as shown by the line (c), when the volume of the tank is increased by about two times the volume of the conventional tank, the charging pressure of the reaction gas may be decreased. As such, a supplying time of the reaction gas from the tank depicted by line c into the reaction chamber may be greatly increased.

As shown in FIGS. 3A, 3B, 4A, 4B, 5A and 5B, when the reaction gases having the same quantity are supplied to the three tanks, it can be noted than an amount of the reaction gas applied to the substrate from the tank 130 of example embodiments may be relatively greater than the amounts of the reaction gases applied to the substrate from the other tanks.

Figure 6:
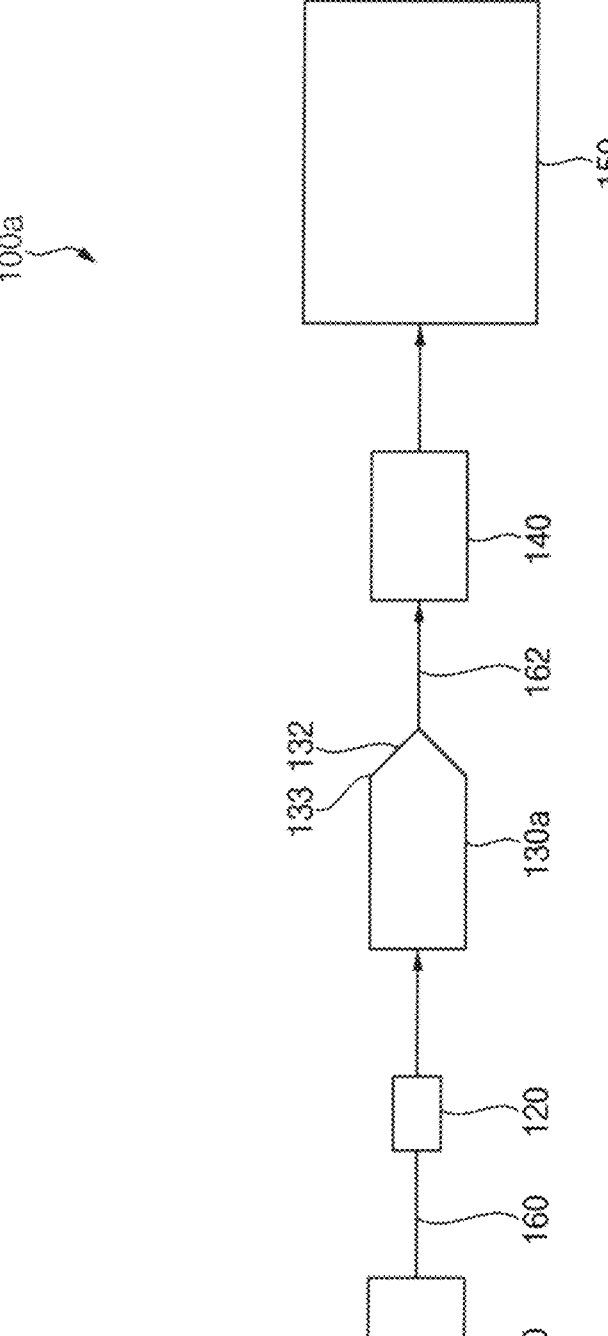
FIG. 6 is a block diagram illustrating a reaction gas supply system in accordance with example embodiments.
Figure 7:
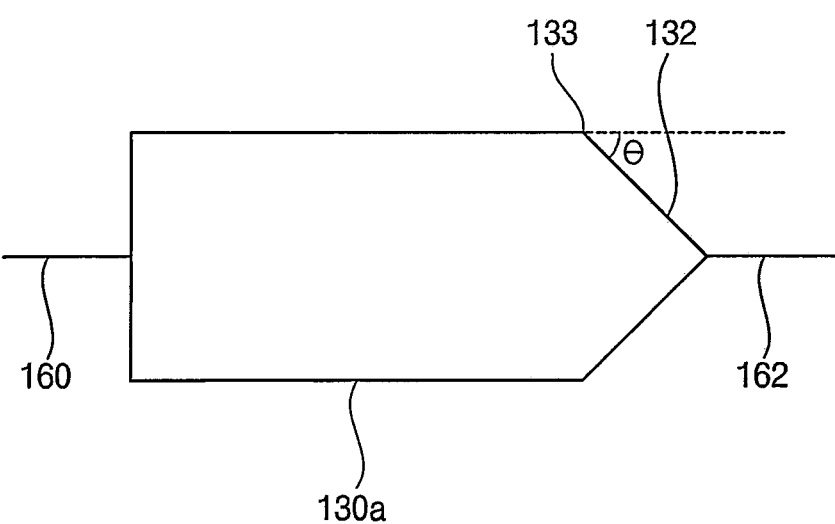
FIG. 7 is an enlarged view illustrating a tank of the reaction gas supply system in FIG. 6.
Figure 8:
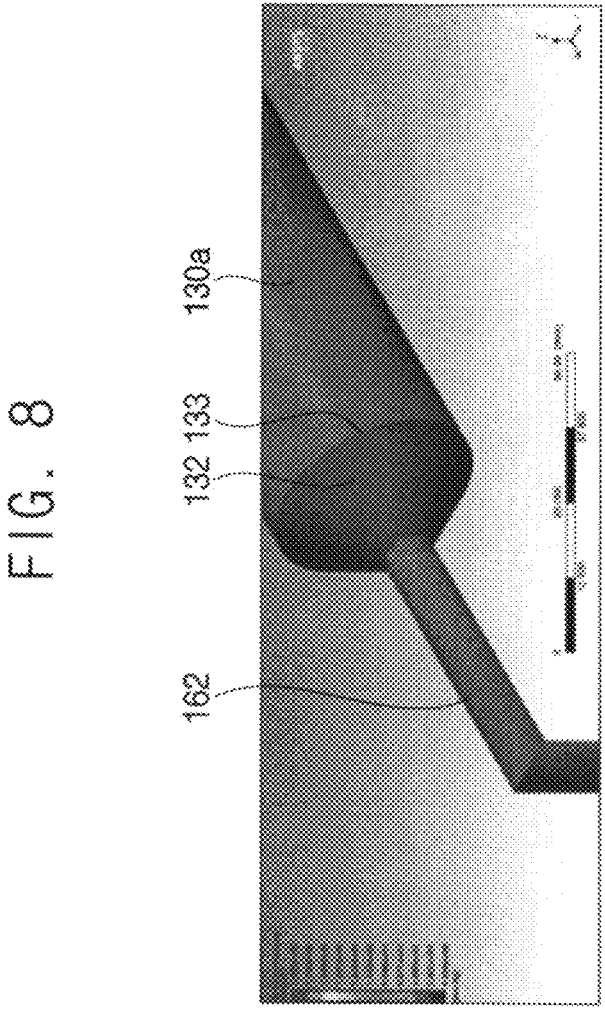
FIG. 8 is an enlarged perspective view illustrating an outlet portion of the tank in FIG. 7.

FIG. 6 is a block diagram illustrating a reaction gas supply system in accordance with example embodiments, FIG. 7 is an enlarged view illustrating a tank of the reaction gas supply system in FIG. 6, and FIG. 8 is an enlarged perspective view of an outlet portion of the tank in FIG. 7.

A reaction gas supply system 100a of this example embodiment may include elements substantially the same as those of the reaction gas supply system 100 in FIG. 1, except for the shape of the tank. Thus, the same reference numerals refer to the same elements and any further descriptions with respect to the same elements may be omitted herein for brevity.

Referring to FIGS. 6 to 8, a tank 130a of this example embodiment may include an outlet portion 132. The outlet portion 132 may be formed at a rear end of the tank 130a oriented toward the valve 140. The outlet portion 132 may be configured to discharge the reaction gas from the tank 130a toward the valve 140. The tank 130a including the outlet portion 132 may have a volume of about 0.16 l to about 0.24 l.

In example embodiments, the outlet portion 132 may have a gradually decreasing diameter toward the valve 140. A maximum diameter of the outlet portion 132 may be a diameter of a portion of the outlet portion 132 connected to the tank 130a. That is, the maximum diameter of the outlet portion 132 may correspond to a diameter of the cylindrical inner space of the tank 130a. In contrast, a minimum diameter of the outlet portion 132 may correspond to a diameter of the second duct 162 connected between the tank 130a and the reaction chamber 150. The outlet portion 132 may have a shape having a gradually decreasing diameter from the maximum diameter to the minimum diameter, e.g., the outlet portion 132 may have a conical shape with a triangular cross-section.

Further, a first angular portion 133 may be formed at a connection portion between the outlet portion 132 and the tank 130a. A diameter of the outlet portion 132 may be gradually decreasing from the first angular portion 133. The outlet portion 132 may have a sidewall inclined toward an axial direction of the tank 130a, i.e., a flowing direction of the reaction gas in the tank 130a. For example, an inclined angle θ of the sidewall of the outlet portion 132 may be about 30° to about 60°. Alternatively, the connection portion between the outlet portion 132 and the tank 130a may have a curved shape, e.g., as opposed to an angular shape illustrated in FIG. 7. In this case, the outlet portion 132 may have a streamlined shape.

Figure 9A:
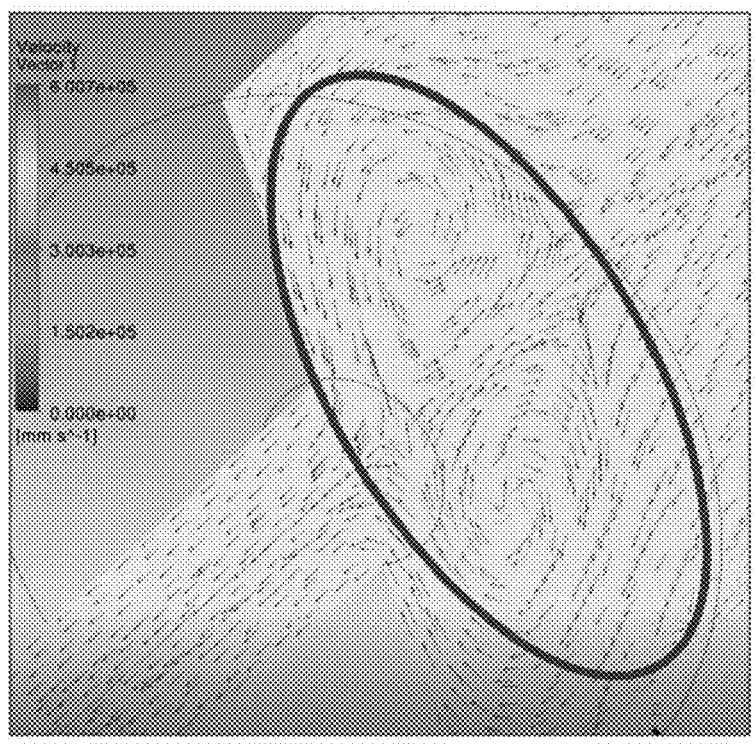
FIG. 9A is a view illustrating an outlet portion flow of a reaction gas through an outlet portion of a conventional tank.
Figure 9B:
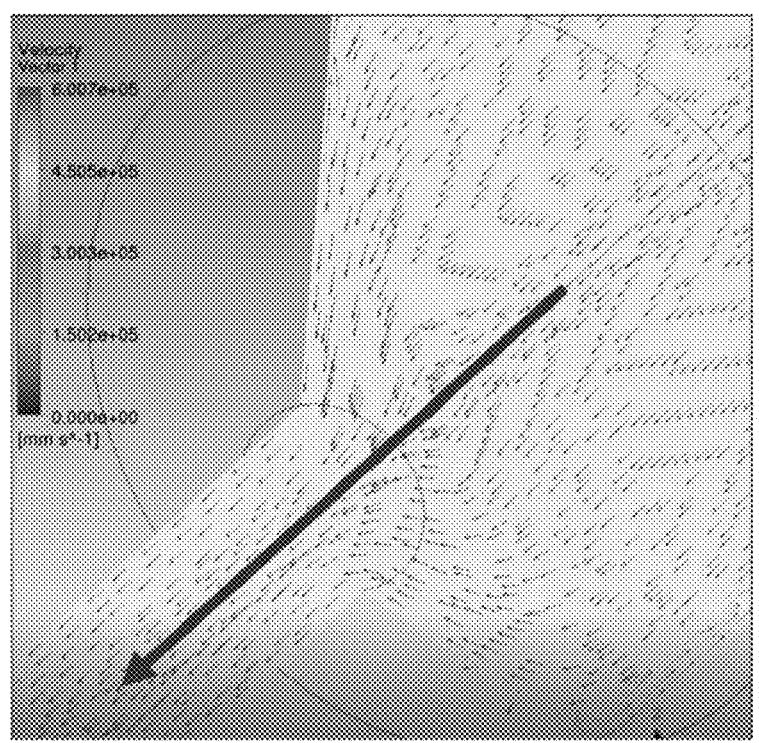
FIG. 9B is a view illustrating an outlet portion flow of a reaction gas through the outlet portion of the tank in FIG. 8.

FIG. 9A is a view illustrating an outlet portion flow of a reaction gas from a tank having a cylindrical shape with a constant diameter. FIG. 9B is a view illustrating an outlet portion flow of a reaction gas from a tank having a conical outlet, e.g., tank 130a in FIG. 8.

As shown in FIG. 9A, when a tank has a cylindrical shape with a constant diameter, an outlet may have a sidewall substantially perpendicular to the flowing direction of the reaction gas. Thus, a diameter of the outlet portion in such a tank may be greatly, e.g., sharply, decreased from the diameter of the tank to the diameter of the second duct. Accordingly, the reaction gas rapidly discharged from the tank toward the second duct may collide against the sidewall to generate a strong vortex at the outlet portion. The vortex may decrease the supplying pressure of the reaction gas.

As shown in FIG. 9B, when the tank 130a has the, e.g., conically shaped, outlet portion 132, which includes the inclined sidewall toward the flowing direction of the reaction gas, the collision of the reaction gas, which may be rapidly discharged from the tank 130a toward the second duct, against the inclined sidewall may be suppressed. Thus, generation of a vortex at the outlet portion 132 may also be suppressed, thereby providing the reaction gas with the high supplying pressure.

Figure 10:
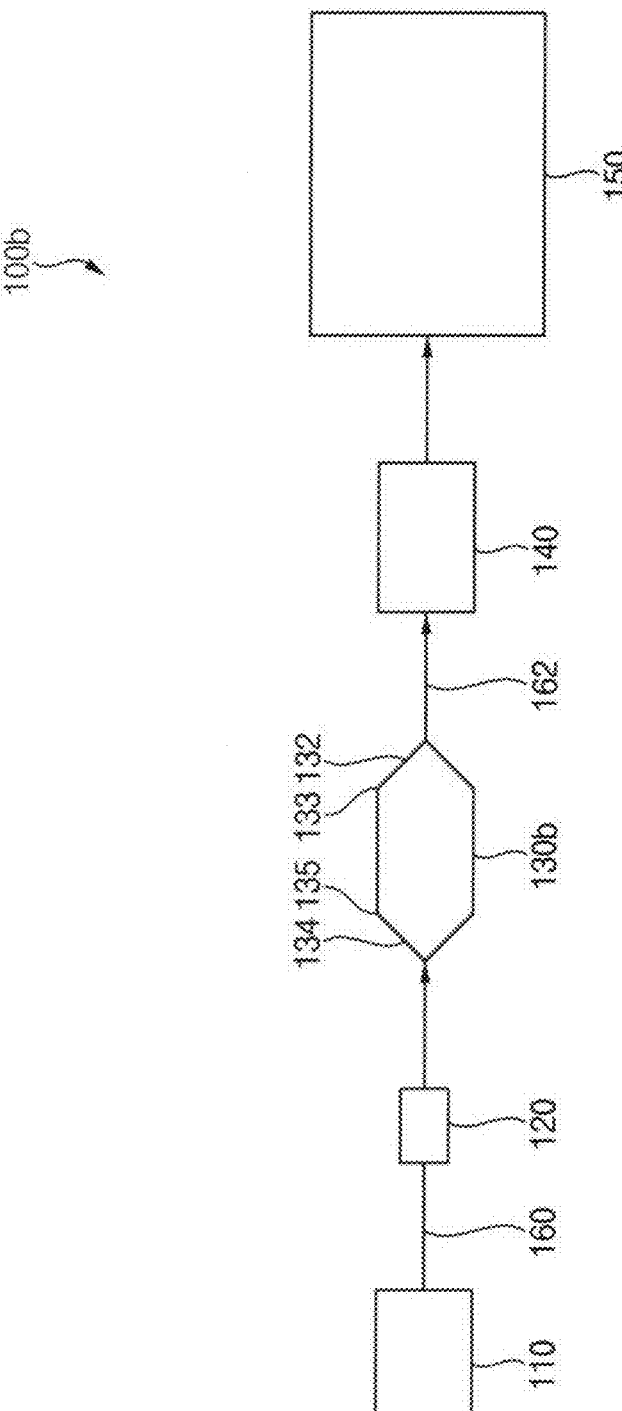
FIG. 10 is a block diagram illustrating a reaction gas supply system in accordance with example embodiments.
Figure 11:
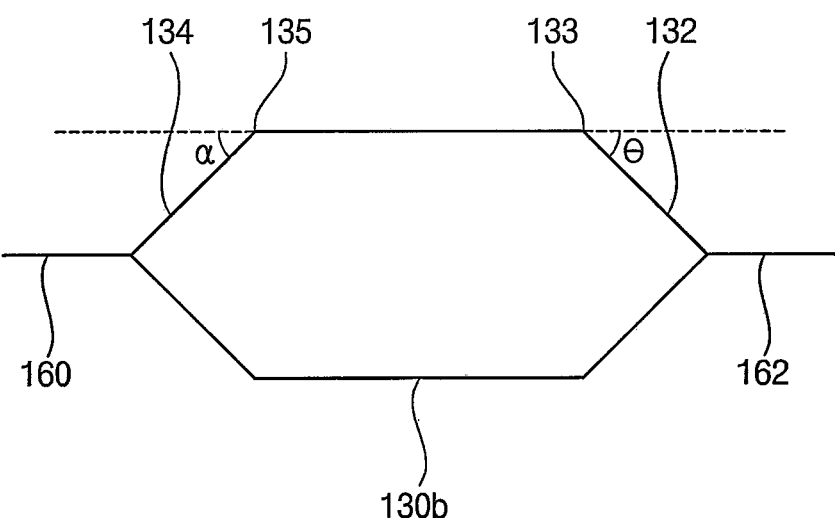
FIG. 11 is an enlarged view illustrating a tank of the reaction gas supply system in FIG. 10.

FIG. 10 is a block diagram illustrating a reaction gas supply system in accordance with example embodiments. FIG. 11 is an enlarged view illustrating a tank of the reaction gas supply system in FIG. 10.

A reaction gas supply system 100b of this example embodiment may include elements substantially the same as those of the reaction gas supply system 100a in FIG. 6, except for the shape of the tank. Thus, the same reference numerals refer to the same elements and any further description with respect to the same elements may be omitted herein for brevity.

Referring to FIGS. 10 and 11, a tank 130b of this example embodiment may further include an inlet portion 134. The inlet portion 134 may be formed at a front end of the tank 130b oriented toward the MFC 120. The reaction gas passing through the MFC 120 may be introduced into the tank 130b through the inlet portion 134. The tank 130b including the inlet portion 134 and the outlet portion 132 may have a volume of about 0.16 l to about 0.24 l, i.e., a total volume of the tank 130b with the inlet portion 134 and the outlet portion 132 may be about 0.16 l to about 0.24 l.

In example embodiments, the inlet portion 134 may have a gradually decreasing diameter from the tank 130b toward the MFC 120. A maximum diameter of the inlet portion 134 may be a diameter of a portion of the inlet portion 134 connected to the tank 130b. That is, the maximum diameter of the inlet portion 134 may correspond to the diameter of the cylindrical inner space of the tank 130b. In contrast, a minimum diameter of the inlet portion 134 may correspond to a diameter of the first duct 160 connected between the tank 130b and the MFC 120. The inlet portion 134 may have a shape having the gradually decreasing diameter from the maximum diameter to the minimum diameter, e.g., a conical shape with a triangular cross-section.

Further, a second angular portion 135 may be formed at a connection portion between the inlet portion 134 and the tank 130b. A diameter of the inlet portion 134 may be gradually decreased from the second angular portion 135. The inlet portion 134 may have a sidewall inclined toward an axial direction of the tank 130b, i.e., toward a flowing direction of the reaction gas in the tank 130b. For example, an inclined angle α of the sidewall of the inlet portion 134 may be about 30° to about 60°. Alternatively, the connection portion between the inlet portion 134 and the tank 130b may have a curved shape. In this case, the inlet portion 134 may have a streamlined shape.

Figure 12:
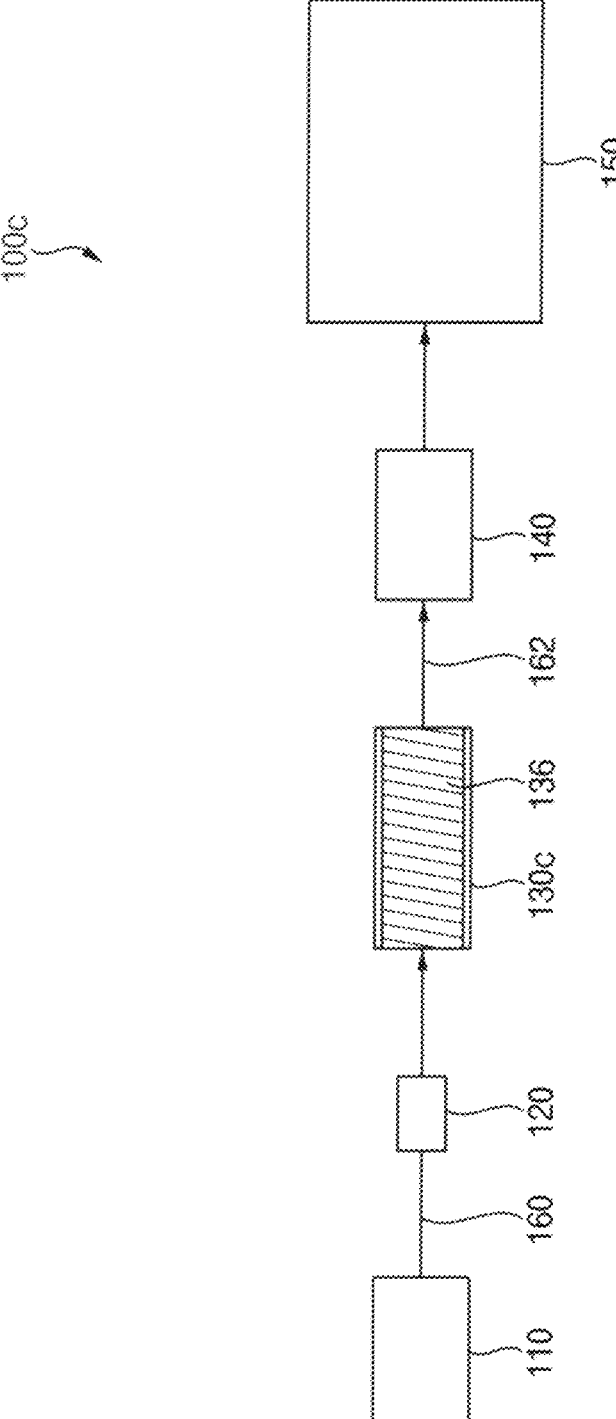
FIG. 12 is a block diagram illustrating a reaction gas supply system in accordance with example embodiments.
Figure 13A:
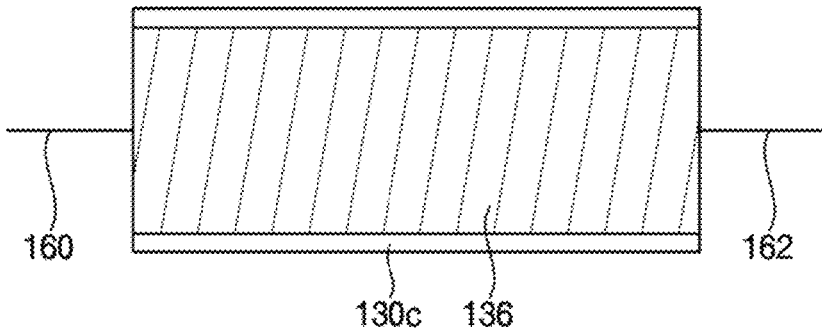
FIG. 13A and FIG. 13B are enlarged views illustrating a tank of the reaction gas supply system in FIG. 12 and a modified tank of the reaction gas supply system in FIG. 11, respectively.

FIG. 12 is a block diagram illustrating a reaction gas supply system in accordance with example embodiments. FIG. 13A is an enlarged view of a tank of the reaction gas supply system in FIG. 12, and FIG. 14 is a view of a flow of a reaction gas through the tank in FIG. 13A.

A reaction gas supply system 100c of this example embodiment may include elements substantially the same as those of the reaction gas supply system 100 in FIG. 1, except for the shape of the tank. Thus, the same reference numerals may refer to the same elements and any further description with respect to the same elements may be omitted herein for brevity.

Referring to FIGS. 12 and 13A, a spiral portion 136 may be formed on an inner surface of a tank 130c. In particular, the spiral portion 136 may be formed on an inner surface of the cylindrical inner space of the tank 130c. For example, the spiral portion 136 may include a groove along an inner surface of the tank 136c that extends continuously in a spiral pattern, e.g., continuous concentric circles around a longitudinal central axis of the tank 130c, along an entire length of the tank 130c between its inlet and outlet portions.

Figure 14:
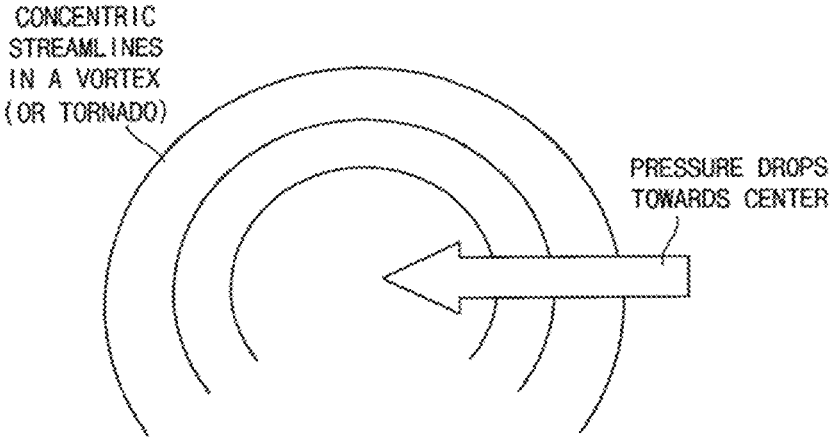
FIG. 14 is a view illustrating a flow of a reaction gas through the tank in FIG. 13A.

As shown in FIG. 14, when the reaction gas in the tank 130c is supplied to the reaction chamber 150 through the opened valve 140, a pressure at a central portion, e.g., along a central longitudinal axis, of the tank 130c may be higher than a pressure at an edge portion, e.g., along inner surfaces, of the tank 130c. Thus, the reaction gas in the tank 130c may be rapidly moved from the edge portion toward the central portion in the tank 130c to form a spiral flow of the reaction gas in the tank 130c by the spiral portion 136. As a result, the reaction gas in the tank 130c may have a high supplying pressure. The tank 130c including the spiral portion 136 may have a volume of about 0.16 l to about 0.24 l.

Figure 13B:
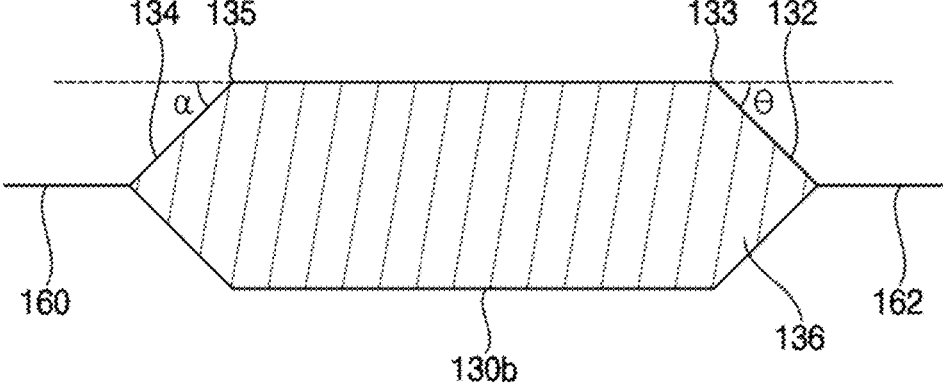

Further, the spiral portion 136 may be formed on the inner surface of the outlet portion 132 in FIG. 7 and/or the inner surface of the inlet portion 134 in FIG. 11 (e.g., as illustrated in FIG. 13B).

Figure 15:
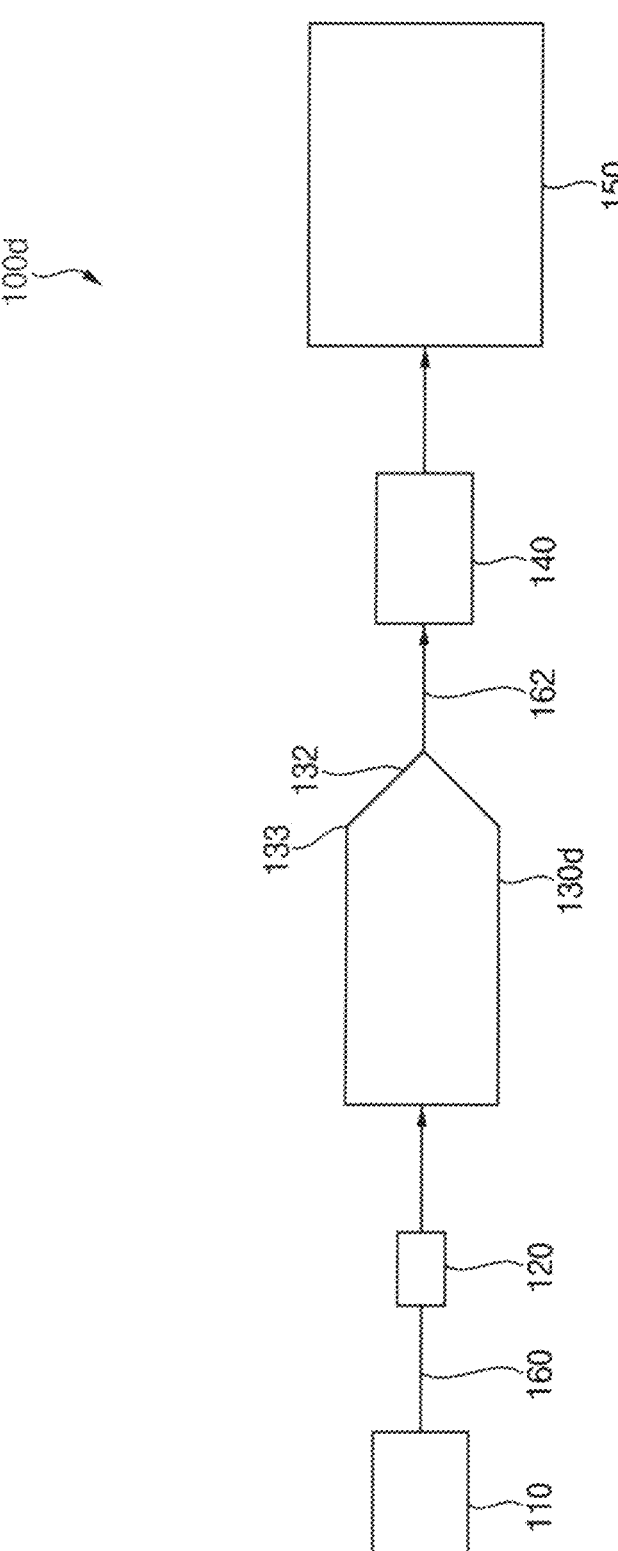
FIG. 15 is a block diagram illustrating a reaction gas supply system in accordance with example embodiments.

FIG. 15 is a block diagram illustrating a reaction gas supply system in accordance with example embodiments.

A reaction gas supply system 100d of this example embodiment may include elements substantially the same as those of the reaction gas supply system 100a in FIG. 6, except for the volume of the tank. Thus, the same reference numerals refer to the same elements and any further descriptions with respect to the same elements may be omitted herein for brevity.

Referring to FIG. 15, a tank 130d of this example embodiment may include the inclined outlet portion 132 in FIG. 7. Further, the tank 130d of this example embodiment may have a volume of about 2.5 times to about 16.5 times the volume of the tank 130 in FIG. 1. That is, the volume of the tank 130d may be about 0.4 l corresponding to the volume of the conventional tank. Although the volume of the tank 130d may be about 0.4 l corresponding to the volume of the conventional tank, the reaction gas in the tank 130d may have a high supplying pressure by the above-mentioned functions of the outlet portion 132.

Figure 16:
FIG. 16 is a block diagram illustrating a reaction gas supply system in accordance with example embodiments.
Figure 16:
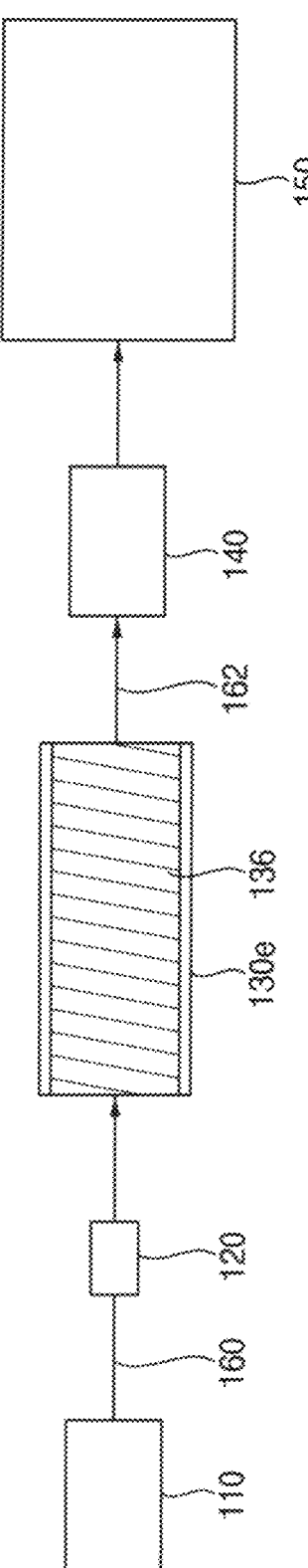

FIG. 16 is a block diagram illustrating a reaction gas supply system in accordance with example embodiments.

A reaction gas supply system 100e of this example embodiment may include elements substantially the same as those of the reaction gas supply system 100c in FIG. 12, except for the volume of the tank. Thus, the same reference numerals refer to the same elements and any further descriptions with respect to the same elements may be omitted herein for brevity.

Referring to FIG. 16, a tank 130e of this example embodiment may include the spiral portion 136 of FIG. 13A. Further, the tank 130e of this example embodiment may have a volume of about 2.5 times to about 16.5 times the volume of the tank 130 in FIG. 1. That is, the volume of the tank 130e may be about 0.48 corresponding to the volume of the conventional tank. Although the volume of the tank 130d may be about 0.40 corresponding to the volume of the conventional tank, the reaction gas in the tank 130d may have a high supplying pressure by the above-mentioned functions of the spiral portion 136.

Figure 17:
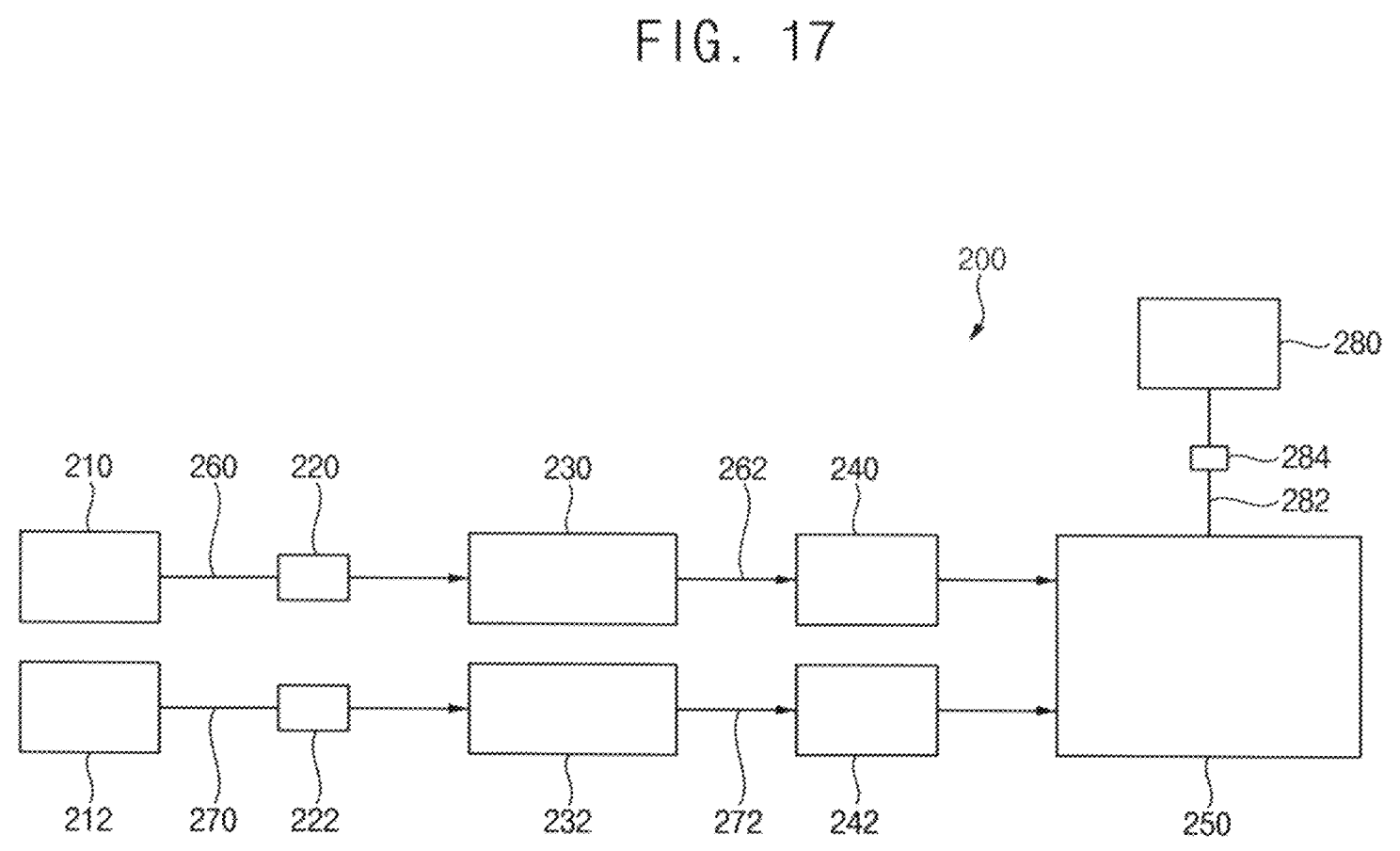

FIG. 17 is a block diagram illustrating an atomic layer deposition (ALD) apparatus including the reaction gas supply system in FIG. 1.

Referring to FIG. 17, an ALD apparatus 200 may include an ALD chamber 250, a first reaction gas supply system, a second reaction gas supply system, and a purge gas supply system.

The first reaction gas supply system may be configured to supply a first reaction gas to the ALD chamber 250. The first reaction gas supply system may include a first evaporator 210, a first MFC 220, a first tank 230, and a first valve 240.

The first evaporator 210 may evaporate a first reaction material to form the first reaction gas supplied to the ALD chamber 250. The first MFC 220 may be arranged between the first evaporator 210 and the ALD chamber 250 to control an amount of the first reaction gas formed by the first evaporator 210 supplied to the ALD chamber 250. The first valve 240 may be arranged between the first tank 230 and the ALD chamber 250.

The first tank 230 may be arranged between the first MFC 220 and the ALD chamber 250. The first tank 230 may be configured to store the first reaction gas. The first tank 230 may have a structure and a volume substantially the same as the structure and the volume of the tank 130 in FIG. 1. Thus, any further descriptions with respect to the first tank 230 may be omitted herein for brevity. Alternatively, the first tank 230 may have a structure substantially the same as the structure of the tank 130*a* in FIG. 6 and/or the structure of the tank 130*c* in FIG. 12.

A first duct 260 may be connected between the first evaporator 210 and the first tank 230. The first MFC 220 may be installed at the first duct 260. A second duct 262 may be connected between the first tank 230 and the ALD chamber 250. The first valve 240 may be installed at the second duct 262.

The second reaction gas supply system may be configured to supply a second reaction gas to the ALD chamber 250. The second reaction gas supply system may include a second evaporator 212, a second MFC 222, a second tank 232, and a second valve 242.

The second evaporator 212 may evaporate a second reaction material to form the second reaction gas supplied to the ALD chamber 250. The second MFC 222 may be arranged between the second evaporator 212 and the ALD chamber 250 to control an amount of the second reaction gas formed by the second evaporator 212 supplied to the ALD chamber 250. The second valve 242 may be arranged between the second tank 232 and the ALD chamber 250.

The second tank 232 may be arranged between the second MFC 222 and the ALD chamber 250. The second tank 232 may be configured to store the second reaction gas. The second tank 232 may have a structure and a volume substantially the same as the structure and the volume of the tank 130 in FIG. 1. Thus, any further descriptions with respect to the second tank 232 may be omitted herein for brevity. Alternatively, the second tank 232 may have a structure substantially the same as the structure of the tank 130*a* in FIG. 6 and/or the structure of the tank 130*c* in FIG. 12.

A first duct 270 may be connected between the second evaporator 212 and the second tank 232. The second MFC 222 may be installed at the first duct 270. A second duct 272 may be connected between the second tank 232 and the ALD chamber 250. The second valve 242 may be installed at the second duct 272.

The purge gas supply system may be configured to supply a purge gas to the ALD chamber 250. The purge gas supply system may include a purge gas tank 280, a purge gas line 282, and a valve 284. The purge gas line 282 may be connected between the purge gas tank 280 and the ALD chamber 250. The valve 284 may be installed at the purge gas line 282 to control the supplying of the purge gas.

Additionally, a carrier gas supply system may be connected to the ALD chamber 250. The carrier gas supply system may include elements substantially the same as those of the reaction gas supply system in FIG. 1.

Figure 18:
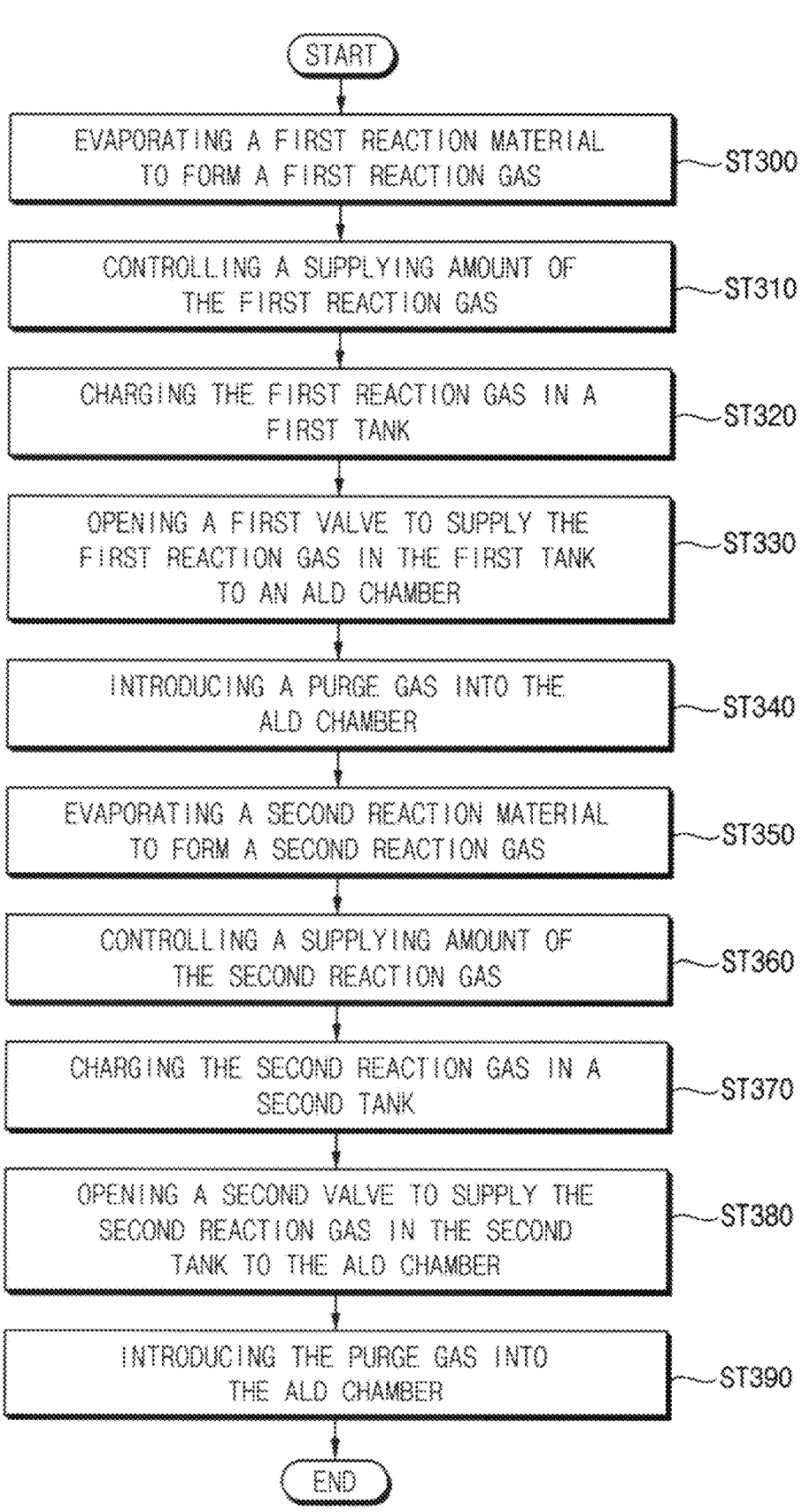
FIG. 18 is a flow chart illustrating a method of processing a substrate using the apparatus in FIG. 17.
Figure 19:
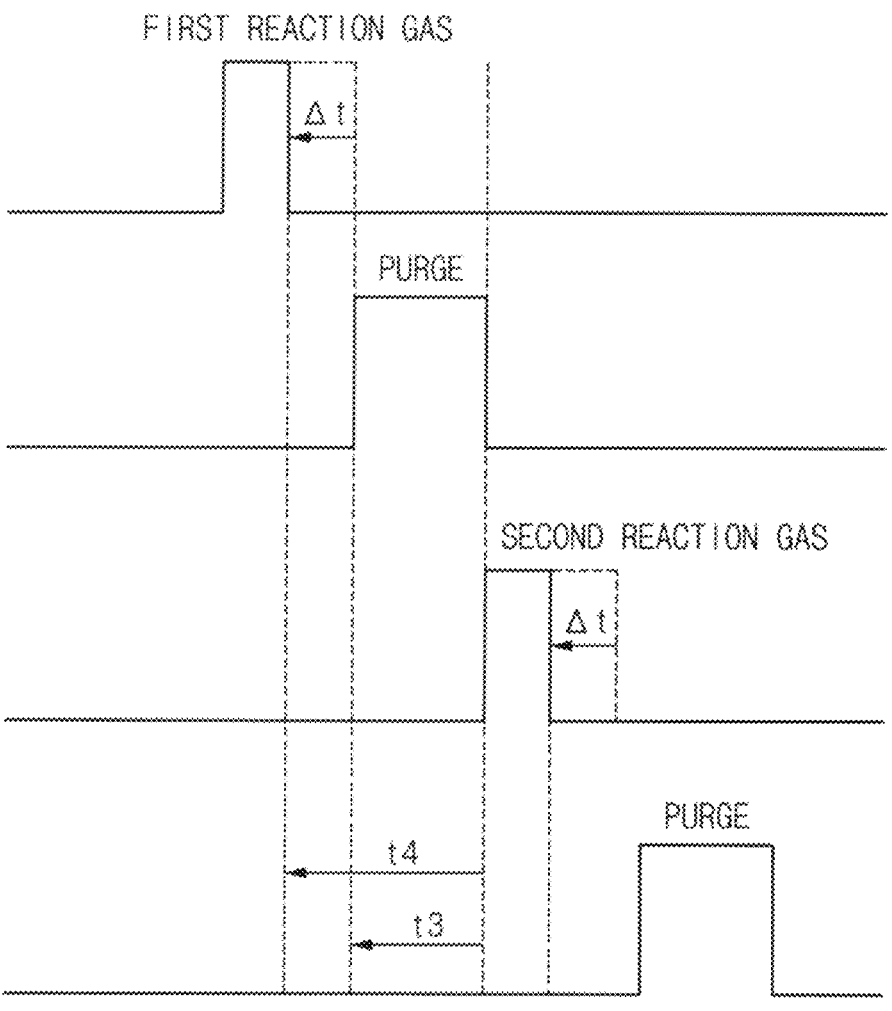
FIG. 19 is a timing chart illustrating the method in FIG. 18 in accordance with times.

FIG. 18 is a flow chart illustrating a method of processing a substrate using the apparatus in FIG. 17. FIG. 19 is a timing chart illustrating the method in FIG. 18 in accordance with times.

A method of processing a substrate in accordance with example embodiments will be described with respect to forming a layer on the substrate by an ALD process. However, the method of example embodiments may also include a method of forming a layer on the substrate by a chemical vapor deposition (CVD) process. Further, the method of example embodiments may use two reaction gases. Alternatively, the method of example embodiments may use at least three reaction gases.

Referring to FIGS. 18 and 19, in operation ST300, the first evaporator 210 may evaporate the first reaction material to form the first reaction gas. The first reaction gas may then be supplied to the first MFC 220 through the first duct 260.

In operation ST310, the first MFC 220 may control the supplying amount of the first reaction gas. In particular, the first MFC 220 may control an amount of the first reaction gas supplied to the ALD chamber 250 in accordance with ALD process conditions.

In operation ST320, the first reaction gas may be charged in the first tank 230. As described above, the volume of the first tank 230 may be about 0.16 l to about 0.24 l corresponding to about 40% to about 60% of the volume of a conventional tank. Thus, although the amount of the first reaction gas in the first tank 230 may be less than the amount of the first reaction gas in the conventional tank, the initial charging pressure of the first reaction gas in the first tank 230 may be higher than the initial charging pressure of the first reaction gas in the conventional tank.

In operation ST330, the first valve 240 may be opened to supply the first reaction gas in the first tank 230 to the ALD chamber 250 through the second duct 262. The first reaction gas may then be applied to the substrate in the ALD chamber 250 to form a layer on the substrate. The layer on the substrate may have good step coverage.

As described above with reference to FIG. 2, when reaction gases having a same quantity are supplied to the conventional tank and the first tank 230 of example embodiments, the reaction gas may be supplied from the first tank 230 to the ALD chamber 250 for a time t2 shorter than the time t1 by the time Δt. In other words, the time required for supplying a same amount of reaction gas from the first tank 230 to the ALD chamber 250 may be shorter, e.g., as compared to a conventional tank with a larger volume.

In operation ST340, after forming the layer on the substrate using the first reaction gas, the purge gas may then be introduced into the ALD chamber 250.

In operation ST350, the second evaporator 212 may evaporate the second reaction material to form the second reaction gas. The second reaction gas may then be supplied to the second MFC 222 through the first duct 270.

In operation ST360, the second MFC 222 may control the supplying amount of the second reaction gas. In particular, the second MFC 222 may control an amount of the second reaction gas supplied to the ALD chamber 250 in accordance with ALD process conditions.

In operation ST370, the second reaction gas may be charged in the second tank 232. As described above, the volume of the second tank 232 may be about 0.16 l to about 0.24 l corresponding to about 40% to about 60% of the volume of the conventional tank. Thus, although the amount of the second reaction gas in the second tank 232 may be less than the amount of the second reaction gas in the conventional tank, the initial charging pressure of the second reaction gas in the second tank 232 may be higher than the initial charging pressure of the second reaction gas in the conventional tank.

In particular, as shown in FIG. 19, because the supplying time of the first reaction gas from the first tank 230 to the ALD chamber is decreased by the time Δt, a supplying time of the second reaction gas from the second evaporator 212 to the second tank 232 may be increased to a time t4 from a time t3.

In operation ST380, the second valve 242 may be opened to supply the second reaction gas in the second tank 232 to the ALD chamber 250 through the second duct 272. The second reaction gas may then be applied to the substrate in the ALD chamber 250 to form a layer on the substrate. The layer on the substrate may have good step coverage.

As described above with reference to FIG. 2, when reaction gases having a same quantity are supplied to the conventional tank and the second tank 232 of example embodiments, the reaction gas may be supplied from the second tank 232 to the ALD chamber 250 for a time t2 shorter than the time t1 by the time Δt.

In operation ST390, after forming the layer on the substrate using the second reaction gas, the purge gas may then be introduced into the ALD chamber 250.

In example embodiments, when the method of example embodiments is applied to a CVD process, the first reaction gas and the second reaction gas may be simultaneously supplied to the reaction chamber.

Further, as shown by line (c) in FIG. 2, when the volume of the tank is increased by about two times the volume of the conventional tank, the charging pressure of the reaction gas may be decreased so that a supplying time of the reaction gas from the tank to the reaction chamber may be greatly increased.

By way of summation and review, a semiconductor device may have a three-dimensional structure to increase an aspect ratio of the semiconductor device. Thus, in order to form a layer having a uniform thickness, i.e., to secure good step coverage, an amount of the reaction gas may be greatly increased. However, the increased amount of the reaction gas may increase the amount of byproducts from the reaction gas, which may clog the exhaust line. As a result, the exhaust line may necessitate repairs requiring to temporarily stop the semiconductor fabrication, thereby increasing operation time and reducing yield.

Therefore, example embodiments provide a reaction gas supply system that reduces an amount of a reaction gas used during manufacturing. Example embodiments also provide an atomic layer deposition apparatus including the above-mentioned system, as well as a method of processing a substrate using the above-mentioned system.

That is, according to example embodiments, a reaction gas supply system may include a tank with a reduced volume, i.e., a volume of about 0.16 l to about 0.24 l that corresponds to a volume of about 40% to about 60% of a volume of a conventional tank, and a smaller amount of reaction gas, as compared to the conventional tank. However, the reaction gas in the tank having the small volume may have a higher pressure than a pressure of the reaction gas in the conventional tank. Thus, generation of byproducts from the reaction gas may be decreased due to the lower amount of the reaction gas, thereby minimizing duct clogging due to byproducts. As a result, the amount of reaction gas used may be remarkably decreased and a layer having good step coverage may be formed using the reaction gas supply system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reaction gas supply system, comprising:

an evaporator configured to evaporate a reaction material to form a reaction gas;

a mass flow controller (MFC) configured to control an amount of the reaction gas supplied to a reaction chamber, the reaction chamber being configured to process a substrate using the reaction gas;

a tank between the reaction chamber and the MFC, the tank being configured to store the reaction gas, and the tank having a volume of about 0.16 L to about 0.24 L; and a valve between the tank and the reaction chamber, wherein the tank includes an outlet portion connected to the valve and an inlet portion, which is located opposite to the outlet portion in a length direction of the tank, connected to the MFC, wherein each of the inlet portion and the outlet portion have a conical shape with inner sidewalls inclined toward an axial direction of the tank, wherein the inlet portion has a gradually decreasing diameter from the tank toward the MFC, wherein the outlet portion has decreasing diameter from the tank toward the valve, and wherein an inner surface of the tank comprises a spiral groove that extends in a spiral pattern along a length of the tank and along surfaces of the inner sidewalls of the outlet portion and the inlet portion, wherein a first duct is connected between the evaporator and the tank, and the MFC is installed at the first duct, wherein a second duct is connected between the tank and the reaction chamber, and the valve is installed at the second duct, wherein the first duct is in fluid communication with the inlet portion of the tank, and a minimum diameter of the inlet portion corresponds to a diameter of the first duct, wherein the second duct is in fluid communication with the outlet portion of the tank, and a minimum diameter of the outlet portion corresponds to a diameter of the second duct, and wherein the spiral groove extends continuously on the inner surface of the tank and the surfaces of the inner sidewalls of the outlet portion and the inlet portion.

2. The reaction gas supply system as claimed in claim 1, wherein the tank has a cylindrical inner space.

3. The reaction gas supply system as claimed in claim 2, wherein the outlet portion is configured to discharge the reaction gas toward the valve.

4. The reaction gas supply system as claimed in claim 3,
wherein the outlet portion has the conical shape with outer
sidewalls inclined toward the axial direction of the
tank, and
wherein the outer sidewalls of the outlet portion are
inclined at an angle of about 30° to about 60°.

5. The reaction gas supply system as claimed in claim 3,
wherein the inlet portion is configured to receive the
reaction gas from the MFC.

6. The reaction gas supply system as claimed in claim 1,
wherein the inlet portion is configured to receive the
reaction gas from the MFC, and
wherein the outlet portion is configured to discharge the
reaction gas to the valve.

7. The reaction gas supply system as claimed in claim 1,
wherein the valve is a pneumatic valve.

8. The reaction gas supply system as claimed in claim 7,
wherein the tank is configured to store the reaction gas
until an interior of the tank reaches a predetermined
pressure, and wherein only the volume of the tank, the inlet portion, the
outlet portion, and the valve control the amount of the
reaction gas entering the reaction chamber.

9. The reaction gas supply system as claimed in claim 1,
wherein the MFC is a single MFC located between the
evaporator and the tank.

10. The reaction gas supply system as claimed in claim 1,
wherein the spiral groove is configured to form a spiral flow
of the reaction gas in the tank.

11. The reaction gas supply system as claimed in claim 1,
wherein the valve is configured to open when a pressure in
the tank reaches a set pressure and supply the reaction gas
from the tank to the reaction chamber.

12. The reaction gas supply system as claimed in claim 11,
wherein the MFC is configured to continuously supply the
reaction gas to the tank until the pressure of the reaction gas
in the tank reaches the set pressure.

\* \* \* \* \*